United States Patent [19]
Sugawara et al.

[11] Patent Number: 5,849,604
[45] Date of Patent: Dec. 15, 1998

[54] METHOD OF MANUFACTURING A SEMICONDUCTOR DEVICE

[75] Inventors: Akira Sugawara; Toshimitsu Konuma, both of Kanagawa, Japan

[73] Assignee: Semiconductor Energy Laboratory Co., Kanagawa-ken, Japan

[21] Appl. No.: 613,372

[22] Filed: Mar. 11, 1996

[30] Foreign Application Priority Data

Mar. 13, 1995  [JP]  Japan ................................. 7-080755

[51] Int. Cl.[6] .................................................. H01L 21/84
[52] U.S. Cl. ........................... 438/30; 438/151; 438/635; 257/72
[58] Field of Search .............................. 349/46, 139, 149, 349/151, 152; 257/59, 72; 438/149, 151, 158, 163, 165, 635, 30

[56] References Cited

U.S. PATENT DOCUMENTS

| | | | |
|---|---|---|---|
| 5,146,301 | 9/1992 | Yamamura et al. | 349/152 |
| 5,359,206 | 10/1994 | Yamamoto et al. | 257/59 |
| 5,422,239 | 6/1995 | Konya | 437/50 |
| 5,576,225 | 11/1996 | Zhang et al. | 437/21 |
| 5,581,382 | 12/1996 | Kim | 349/149 |
| 5,648,826 | 7/1997 | Song et al. | 349/139 |

FOREIGN PATENT DOCUMENTS

| | | | |
|---|---|---|---|
| 2-210420 | 8/1990 | Japan . | |
| 2-216129 | 8/1990 | Japan . | |
| 2-232628 | 9/1990 | Japan | 349/149 |

*Primary Examiner*—Charles L. Bowers, Jr.
*Assistant Examiner*—Leon Radomsky
*Attorney, Agent, or Firm*—Fish & Richardson P.C.

[57] ABSTRACT

A resist mask is formed on an electrode mainly made of aluminum. An anodic oxide film is formed on the electrode excluding the masked region by performing anodization in an electrolyte. A contact hole can easily be formed in the masked region because the anodic oxide film is not formed there. By removing a portion of the gate electrode which corresponds to an opening in forming a contact electrode, the gate electrode can be divided at the same time as the contact electrode is formed.

13 Claims, 10 Drawing Sheets

METHOD OF MANUFACTURING A SEMICONDUCTOR DEVICE

BACKGROUND OF THE INVENTION

The present invention relates to a technique of forming a wiring contact to an electrode or a wiring line which is made only or mainly of aluminum.

There is known a thin-film transistor which is manufactured by a process as shown in FIGS. 5A to 5D. This type of thin-film transistor is formed on a glass substrate, and has a small off-current, which is a very important factor in applying it to a liquid crystal display device or other thin-film integrated circuits.

In the thin-film transistor shown in FIGS. 5A to 5D, the off-current characteristic is improved by the offset gate regions, which are electrical buffer regions formed between the channel forming region and the source/drain regions. The configuration as shown in FIGS. 5A to 5D is described in Japanese Unexamined Patent Publication No. 4-360580, for instance.

A manufacturing process of the thin-film transistor shown in FIGS. 5A to 5D will be briefly described below. First, a glass substrate 201 is prepared, and a silicon oxide film 202 is formed on its surface by sputtering or plasma CVD. The silicon oxide film 202 serves as an undercoat film for preventing impurities or the like from diffusing from the glass substrate 201. An amorphous silicon film is then deposited by plasma CVD or low-pressure thermal CVD. If necessary, the amorphous silicon film is crystallized by conducting a heat treatment or illuminating it with laser light. Where high performance is not required, the amorphous silicon film may be left as it is.

After an active layer 203 of a thin-film transistor is formed by patterning the amorphous silicon film, a silicon oxide film 204 to serve as a gate insulating film is deposited by plasma CVD or sputtering. A gate electrode 205 is then formed by depositing and patterning an aluminum film. The gate electrode 205 is called a first-layer wiring. (FIG. 5A)

Subsequently, an anodic oxide layer 206 is formed around the gate electrode 205 by anodization in which the gate electrode 205 is used as an anode. In the thin-film transistor having the configuration of FIGS. 5A to 5D, the technique of forming the anodic oxide layer 206 is an important point. (FIG. 5B)

Then, as shown in FIG. 5C, impurity ions (assumed here to be P (phosphorus) ions) for forming source/drain regions are implanted into the active layer 203 by ion implantation or plasma doping. In this step, no impurity ions are introduced into regions 208 and 209 under the gate electrode 205 and the anodic oxide layer 206 around it both of which serve as a mask. On the other hand, impurity ions are introduced into regions 207 and 210, which are thereby made a source region and a drain region, respectively. Among the regions that receive no impurity ions, the regions 208 under the anodic oxide layer 206 are made offset gate regions and the region 209 under the gate electrode 205 is made a channel forming region.

Since the impurity ion implanting step of FIG. 5C can be performed in a self-aligned manner, such a complicated step as a mask alignment step is not needed, making this manufacturing process very high in productivity. Further, resulting devices have a benefit of very small variations in characteristics.

After the ion implantation step of FIG. 5C, a silicon oxide 211 as an interlayer insulating film is deposited. After formation of contact holes, a source electrode 212 and a drain electrode 213 are formed. At the same time, a lead-out electrode 214 for the gate electrode 205 is formed. Although in FIG. 5D the source and drain electrodes 212 and 213 and the lead-out electrode 214 for the gate electrode 205 are shown as if to exist in the same vertical cross-section, actually the lead-out electrode 214 exists on the viewer's side or the opposite side if it is assumed that the gate electrode 205 exists on the paper surface. The source and drain electrode 212 and 213 and the lead-out electrode 214 are called a second-layer wiring.

The thin-film transistor having the manufacturing process of FIGS. 5A to 5D is superior in characteristics and in the method of forming the offset gate regions. For application to a large-area active matrix liquid crystal display device or other large-scale integrated circuits, the use of aluminum for the gate electrode is very advantageous in reducing the wiring resistance. This is particularly important in an insulated-gate field-effect transistor, which is a voltage-controlled device. The configuration of FIGS. 5A to 5D has a further advantage that undesired leakage or interaction with various wirings formed on the interlayer insulating film can be greatly reduced because the gate electrode and the gate wiring line are covered with a dense anodic oxide film having a high breakdown voltage.

Although the thin-film transistor of FIGS. 5A to 5D is very useful, the step of FIG. 5D is associated with a very difficult situation. In the step of FIG. 5D, not only the contact holes for the source and drain electrodes 212 and 213 but also those for the lead-out electrode 214 for the gate electrode 205 need to be formed.

As for formation of the contact holes for the source and drain electrodes 212 and 213, the films to be removed partially are the silicon oxide films 211 and 204. Therefore, wet etching is performed by using a hydrofluoric acid type etchant such as buffer hydrofluoric acid (BHF). Since the etching rate of buffer hydrofluoric acid for silicon is much smaller than for silicon oxide, etching can be finished when it reaches the active layer 203; that is, the active layer 203 can be used as an etching stopper.

However, as for formation of the contact hole for the lead-out electrode 214, the silicon oxide film 211 and the aluminum oxide layer 206 (mainly made of $Al_2O_3$) formed by anodization need to be etched. It has been found that if this etching process is performed by using buffer hydrofluoric acid, it cannot be finished when etching of the aluminum oxide layer 206 has been completed. This is due to the fact that the etching of the aluminum oxide layer 206 with a hydrofluoric acid type etchant does not proceed uniformly but proceeds as if a fragile thing crumbled. That is, the etching process is not such that aluminum starts to be etched after the etching of the aluminum oxide layer 206 has been completed, but is such that even during etching of the aluminum oxide layer 206 etching also proceeds in the aluminum gate electrode 205 due to an etchant permeating it. It has been found that this problem is common to hydrofluoric acid type etchants.

FIGS. 6A and 6B show how the oxide layer 206 is etched with a hydrofluoric acid type etchant. First, as shown in FIG. 6A, the silicon oxide film 211 is etched with a hydrofluoric acid type etchant (for instance, buffer hydrofluoric acid). The aluminum oxide layer 206 is then etched, in which the aluminum gate electrode 205 is also etched while the etching of the oxide layer 206 proceeds.

The oxide layer 206 and the gate electrode 205 have thicknesses of 2,000 Å and 4,000 to 7,000 Å, respectively.

In general, the etching rate of aluminum oxide is higher than that of aluminum by about several tens of percent. The oxide layer 206 is not etched evenly and finely, but is removed so as to crumble piece by piece. Therefore, at a time point when the etching of the oxide layer 206 has been completed, overetching necessarily occurs in the gate electrode 205 as shown by 302 in FIG. 6B. As a result, there may occur an even that portions of the oxide layer 206 and the silicon oxide film 211 remaining above the overetched portion collapse. This is understood as a phenomenon similar to an etching process by a lift-off method. This may cause an operation failure of a resulting thin-film transistor.

To solve the above problem, the present inventors have developed a technique in which the etchant is changed to a chromic acid mixture in a state that the subject portion of the silicon oxide film has ben removed, and the aluminum oxide layer 206 is etched with the chromic acid mixture. The etching of the silicon oxide film 211 with a hydrofluoric acid type etchant, particularly buffer hydrofluoric acid, is highly reproducible and can be evaluated quantitatively. Therefore, the change of an etchant at a time point when the aluminum oxide layer 206 is exposed can be done relatively easily.

The chromic acid mixture is a solution produced by adding chromic acid to a solution containing phosphoric acid, acetic acid, and nitric acid. Only the aluminum oxide layer 206 can be etched selectively with the chromic acid mixture, because it has almost no ability of etching aluminum. That is, the chromic acid mixture enables the aluminum gate electrode 205 to be used as an etching stopper.

However, there occurs new problems. That is, the composition of the chromic acid mixture considerably varies during etching, so that its etching effect varies from one manufacturing step to another. This is undesirable because it will cause failures in devices produced and variations in characteristics among those.

As another problem, when the aluminum oxide layer 206 is removed by using the chromic acid mixture, a passive film is formed on the exposed surface of the aluminum gate electrode 205. Although it is this passive film that stops etching of the gate electrode 205 mainly made of aluminum, the passive film impairs electrical contact between the lead-out electrode (indicated by 214 in FIG. 5D) and the gate electrode 205 because of its high resistivity.

To solve this problem, it is necessary to remove the passive film with a hydrofluoric acid type etchant, which however causes etching damage to the gate electrode 205 in the same manner as shown in FIG. 6B. Further, since the passive film is very thin, a subtle etching process is needed, which is necessarily low in reproducibility. This results in a serious problem in productivity.

Another approach to etch the aluminum oxide layer 206 would be to use dry etching. However, no dry etching method is currently available which can selectively etch the aluminum oxide layer 206 with high reproducibility.

Further, in practice, it is an ordinary procedure to produce a plurality of thin-film transistors at the same time rather than a single one.

For example, in an active matrix liquid crystal display device incorporating peripheral driver circuits, thin-film transistors in a matrix of several hundred by several hundred or more and thin-film transistors (at least several hundred) constituting the peripheral driver circuits are formed on the same substrate.

In this case, it is an ordinary procedure to perform anodic oxidation in a manufacturing step that is common to steps for all the thin-film transistors. (Although naturally it is conceivable to perform anodic oxidation in a plurality of steps, this complicates the manufacturing process, causing such problems as reduction of the yield and increase of the manufacturing cost.)

In such an anodizing step, the gate electrodes of all the thin-film transistors are electrically connected together. Therefore, a step of disconnecting the gate electrodes from each other after the anodizing step at a necessary portion.

This is not limited to the case of the active matrix liquid crystal display device but is applicable to the case of manufacturing other integrated circuits.

On the other hand, to reduce the production cost and increase the yield in the manufacture of the active matrix liquid crystal display device and other thin-film integrated circuits, it is important to decrease the number of manufacturing steps.

For example, at present, the spread of the active matrix liquid crystal display device strongly depends on the reduction of the manufacturing cost. In recently developed various information processing apparatuses using the active matrix liquid crystal display device, the latter occupies a large part of the manufacturing cost of those apparatuses. Therefore, reducing the manufacturing cost of the active matrix display device directly leads to reduction of the manufacturing cost of those information processing apparatuses.

On the other hand, the manufacturing process of thin-film transistors accounts for a considerable part of the manufacturing process of the active matrix liquid crystal display device. Therefore, reducing the manufacturing cost of thin-film transistors is important for reduction of the manufacturing cost of the active matrix liquid crystal display device.

SUMMARY OF THE INVENTION

As described above, although the technique of forming an oxide layer around an aluminum gate electrode by anodization and then forming offset gate regions in a self-aligned manner by ion implantation with the aluminum oxide layer used as a mask is superior in some respects, it is associated with a problem in manufacture, i.e., difficulties in forming a contact hole by etching the aluminum oxide layer.

An object of the present invention is to solve the above problem. Another object of the invention is to provide a technique which can form, easily and with high reproducibility, a contact electrode or wiring line for an aluminum electrode or wiring line around which an aluminum oxide layer is formed.

The spread of various devices (e.g., an active matrix liquid crystal display device) using thin-film transistors depend on the reduction of the manufacturing cost of the thin-film transistors. Therefore, it is very important from the industrial point of view to minimize the number of manufacturing steps of thin-film transistors, to thereby reduce their manufacturing cost.

It is therefore a further object of the invention to minimize the number of steps of a manufacturing process of thin-film transistors each having a configuration in which an oxide layer is formed around an aluminum gate electrode by anodization, to thereby reduce the manufacturing cost of the thin-film transistors.

According to one aspect of the invention, there is provided a manufacturing method of a semiconductor device, comprising the steps of:

forming a wiring line or electrode made only or mainly of aluminum;

forming a mask at least in a region of the wiring line or electrode where a contact will be formed later and in a region of the wiring line or electrode where it will be divided later; and forming an anodic oxide film on the wiring line or electrode in a region excluding the regions where the mask has been formed, by performing anodization in an electrolyte using the wiring line or electrode as an anode.

In the above method, "mainly made of aluminum" means that aluminum is mixed with some element. For example, silicon or a rare earth element such as scandium may be mixed into aluminum by 0.1 to 1% to prevent its abnormal growth in, for instance, a heat treatment which is conducted in a manufacturing process of a semiconductor device.

FIGS. 1A to 1D show a specific example of the above method, which is a process of manufacturing a thin-film transistor on a glass substrate. First, in a step shown in FIG. 1A, a gate electrode 105 made of scandium-mixed aluminum is formed and then resist masks 106 and 107 are formed. Thereafter, an anodic oxide film 108 is formed on the gate electrode 105 in regions excluding the masked regions by anodization in an electrolyte.

The mask 106 is formed in a region where a contact electrode to the gate electrode 105 should be formed later. The mask 107 is formed in a region where the gate electrode 105 should be divided later.

According to another aspect of the invention, there is provided a manufacturing method of a semiconductor device, comprising the steps of:

forming a wiring line or electrode made only or mainly of aluminum;

forming a mask at least in a region of the wiring line or electrode where a contact will be formed later and in a region of the wiring line or electrode where it will be divided later;

forming an anodic oxide film on the wiring line or electrode in a region excluding the regions where the mask has been formed, by performing anodization in an electrolyte using the wiring line or electrode as an anode;

forming a silicon oxide film so as to cover the wiring line or electrode;

partially etching the silicon oxide film to thereby expose the wiring line or electrode in the regions where the anodic oxide film has not been formed;

forming a metal film over the entire structure; and patterning the metal film to thereby form the contact to the wiring line or electrode as well as divide the wiring line or electrode at a different location.

FIGS. 1A to 1D show a specific example of the above method. Referring to FIG. 1A, first a gate electrode 105 mainly made of aluminum is formed. Then, resist masks 106 and 107 are formed respectively in a region where a contact electrode should be formed later and in a region where the gate electrode 105 should be divided later. Thereafter, an anodic oxide film 108 is formed on the gate electrode 105 in regions excluding the masked regions by anodization in an electrolyte. (FIG. 1A)

Subsequently, in a step shown in FIG. 1C, a silicon oxide film 100 as an interlayer insulating film is deposited. By partially etching the silicon oxide film 100, a contact hole 113 for the gate electrode 105 and an opening 114 are formed.

In this state, a metal film 117 to constitute a contact electrode and a wiring line is formed. A resist mask 118 for patterning of the metal film 117 is then formed. (FIG. 1C)

Thereafter, a contact to the gate electrode 105 is formed by etching, i.e., patterning the metal film 117. At the same time, the gate electrode 105 is divided by removing, by etching, both of the metal film 117 and the gate electrode 105 in the region of the opening 114. (FIG. 1D)

Examples of the etchant for etching the silicon oxide film 100 are hydrofluoric acid type etchants such as hydrofluoric acid, buffer hydrofluoric acid (BHF), hydrofluoric acid or buffer hydrofluoric acid mixed with acetic acid, and each of these hydrofluoric acid type etchant added with a surface active agent. An example of buffer hydrofluoric acid is a mixture of ammonium fluoride and hydrofluoric acid (10:1). These hydrofluoric acid type etchants exhibit a much higher etching rate for silicon oxide and aluminum than for silicon. Therefore, they are useful in selectively removing a member made only or mainly of silicon oxide or aluminum, or forming a contact hole in such member.

Alternatively, dry etching may be performed by using a fluorine type gas such as $CF_4$ or $CHF_3$.

According to a still another aspect of the invention, there is provided a manufacturing method of a semiconductor device, comprising the steps of:

forming an insulating film on a semiconductor;

forming a wiring line or electrode made only or mainly of aluminum on the insulating film;

forming a mask at least in a region of the wiring line or electrode where a contact will be formed later and in a region of the wiring line or electrode where it will be divided later;

forming an anodic oxide film on the wiring line or electrode in a region excluding the regions where the mask has been formed, by performing anodization in an electrolyte using the wiring line or electrode as an anode;

removing the mask;

forming an insulating film so as to cover the wiring line or electrode;

forming, at the same time, contact holes for the semiconductor and the wiring line or electrode, and exposing the wiring line or electrode in the region where it will be divided later;

forming a metal film over the entire structure; and patterning the metal film to thereby form the contact to the wiring line or electrode as well as divide the wiring line or electrode in the region so intended.

According to a further aspect of the invention, there is provided a manufacturing method of a semiconductor device, comprising the steps of:

forming a wiring line or electrode made only or mainly of aluminum;

forming an anodic oxide film on the wiring line or electrode excluding a predetermined region thereof, by performing anodization in an electrolyte using the wiring line or electrode as an anode; and forming a contact electrode to the predetermined region of the wiring line or electrode and, at the same time, removing part of the wiring line or electrode.

It is noted that the invention can be applied to manufacture of not only thin-film transistors but also general MOS transistors.

According to the invention, by forming, in an anodizing step, an anodic oxide layer on and in the vicinity of a wiring line or electrode made only or mainly of aluminum so as to exclude a selected region by forming a mask in advance, formation of a contact hole to the above wiring line or electrode in a subsequent step can be facilitated. As a result, the productivity and the production yield of a semiconductor device configured such that an anodic oxide film is formed on and in the vicinity of a wiring line or electrode made only or mainly of aluminum can be greatly improved.

Further, by also masking, in the above step of forming a mask before the above anodizing step, a region where gate electrodes of a plurality of thin-film transistors should be later disconnected from each other, this region can be prevented from being covered with an anodic oxide film. Etching can also be effected in this region in a subsequent step of forming a wiring line or electrode by patterning. As a result, no separate step is needed to disconnect the gate electrodes from each other.

DETAILED DESCRIPTION OF THE PREFERRED EMBODIMENTS

Embodiment 1

This embodiment is characterized in that in forming a thin-film transistor having a gate electrode mainly made of aluminum an anodic oxide layer is not formed on a portion of the gate electrode and this portion is used as a contact portion to the gate electrode. This embodiment is also characterized in that a step of disconnecting gate electrodes from each other which step is necessary in forming a plurality of thin-film transistors at the same time is performed at the same time as formation of contact electrodes or wiring lines for source/drain regions and even contact electrodes or wiring lines for gate electrodes.

FIGS. 1A to 1D, FIGS. 2A to 2D, FIGS. 3A to 3D, and FIGS. 4A to 4D show a manufacturing process according to this embodiment. FIGS. 2A to 2D are sectional views taken along line A—A' in FIG. 1A. FIGS. 3A to 3D are sectional views taken along line B—B' in FIG. 1A. FIGS. 4A to 4D are sectional views taken along line C—C' in FIG. 1A. FIGS. 1A, 2A, 3A and 4A correspond to each other, FIGS. 1B, 2B, 3B and 4B correspond to each other, and so forth.

First, a 3,000-Å-thick silicon oxide film 102 as an undercoat film is deposited on a glass substrate 101 by plasma CVD. Although a glass substrate is used in this embodiment because it assumes a process of producing an active matrix liquid crystal display device, other proper insulative substrates or substrates having an insulative surface may also be used.

A 500-Å-thick amorphous silicon film is deposited on the undercoat film 102 by plasma CVD or low-pressure thermal CVD. The amorphous silicon film is a starting film for forming an active layer of an intended thin-film transistor. The active layer means a semiconductor layer in which source/drain regions and a channel forming region are formed.

Figure 9A:
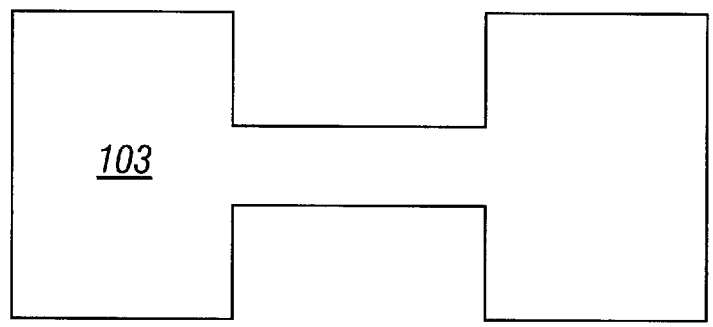
FIGS. 9A and 9B and FIGS. 10A and 10B are top views showing the manufacturing process of a thin-film transistor according to the first embodiment of the invention.

The amorphous silicon film is then crystallized by heating or illumination with laser light. In this embodiment, a crystalline silicon film is formed by illumination with KrF excimer laser light. The thus-formed crystalline silicon film is patterned into an active layer 103 of the thin-film transistor. FIG. 9A is a top view of the active layer 103 in this state.

Although FIG. 9A shows only one active layer 103, active layers 103 corresponding to several hundred to several hundred thousand or more thin-film transistor are formed at the same time by patterning on the glass substrate 101 of several tens of centimeters by several tens of centimeters in producing a pixel area and peripheral driver circuits of an active matrix liquid crystal display device.

After the formation of the active layer 103, a 1,000-Å-thick silicon oxide film 104 to serve as a gate insulating film is deposited by plasma CVD. A 5,000-Å-thick film mainly made of aluminum which film is to become a gate electrode is deposited by electron beam evaporation or sputtering. To prevent abnormal growth of aluminum, scandium is mixed into the above film by 0.1 wt %.

The film mainly made of aluminum is then patterned into a gate electrode 105. The gate electrode (also called a gate wiring line) 105 is referred to as a first-layer wiring.

Resist masks 106 and 107 are then formed on the gate electrode 105. A contact hole for the gate electrode 105 will be formed in a subsequent step in the region where the resist mask has been formed. Gate electrode disconnection will be later performed in the region where the resist mask 107 has been formed.

Subsequently, a layer 108 made of an oxide of the material mainly made of aluminum is formed by anodization in an electrolyte. The thickness of the oxide layer 108 is set at 2,000 Å. In this embodiment, an ethylene glycol solution that has been pH-adjusted by ammonia into a neutral state is used as an electrolyte.

In this anodizing step, the portions of the gate electrode 105 which is covered with the resist masks 106 and 107 does not contact with the electrolyte, so that no oxidation proceeds there and the oxide layer 108 is not formed thereon.

Figure 1A:
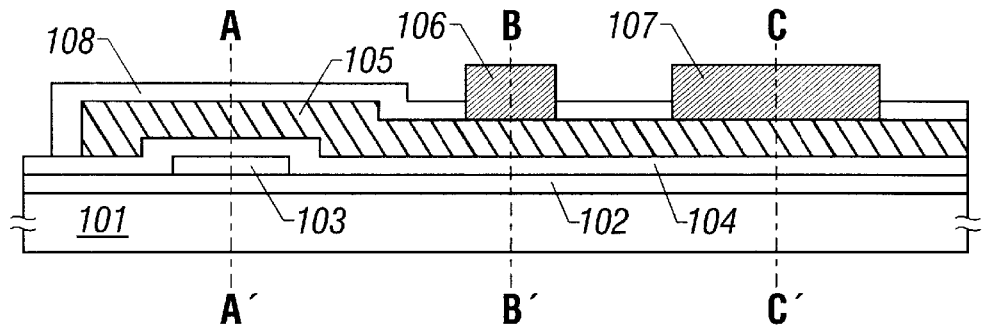
FIGS. 1A to 1D, FIGS. 2A to 2D, FIGS. 3A to 3D, and FIGS. 4A to 4D are sectional views showing a manufacturing process of a thin-film transistor according to a first embodiment of the present invention.
Figure 1B:
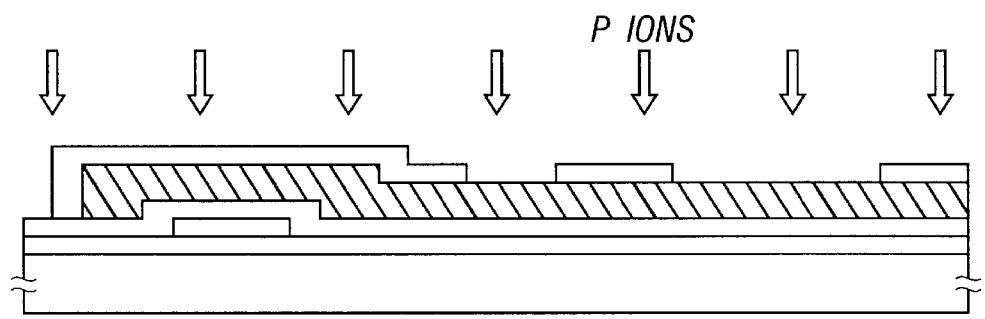
Figure 2A:
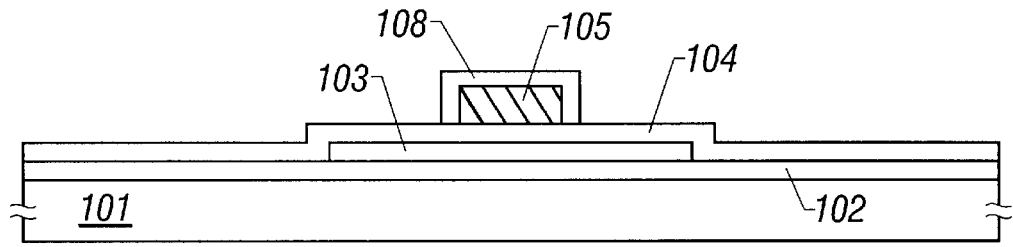
Figure 2B:
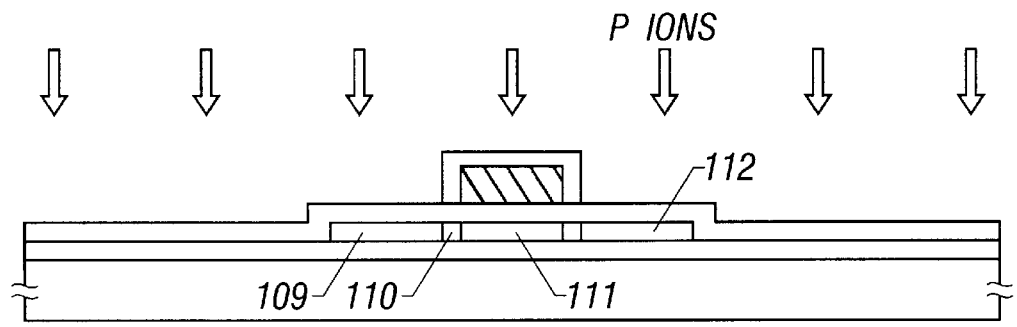
Figure 3A:
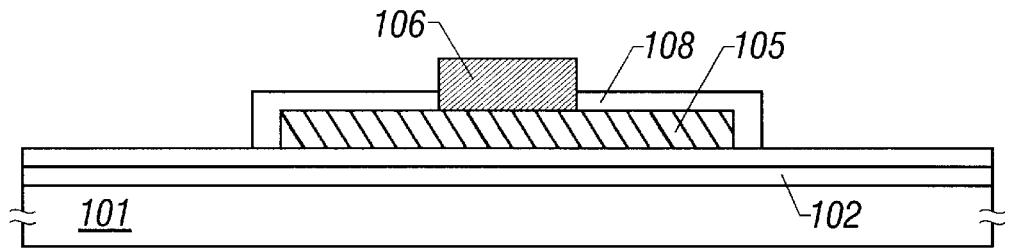
Figure 3B:
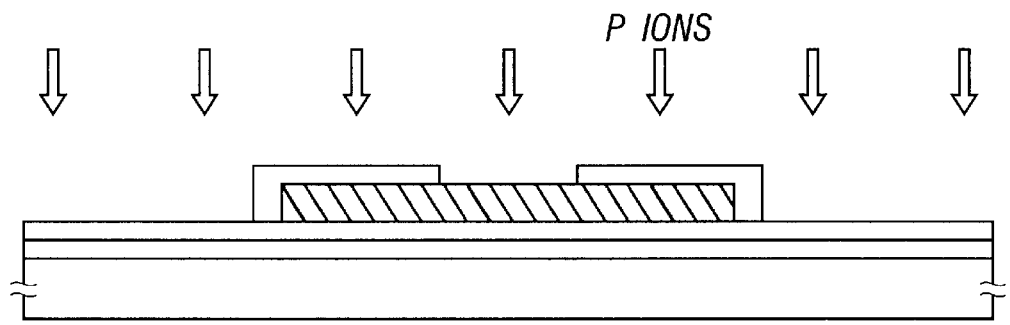
Figure 4A:
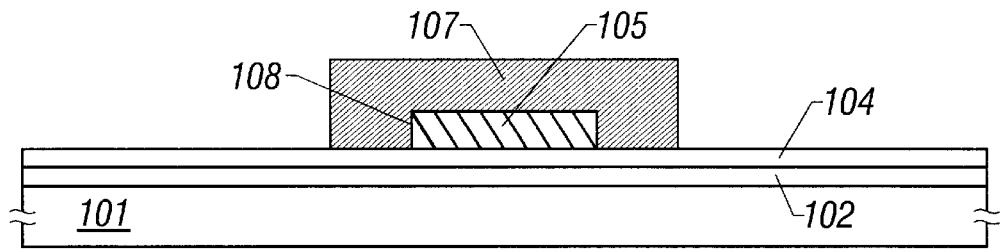
Figure 4B:
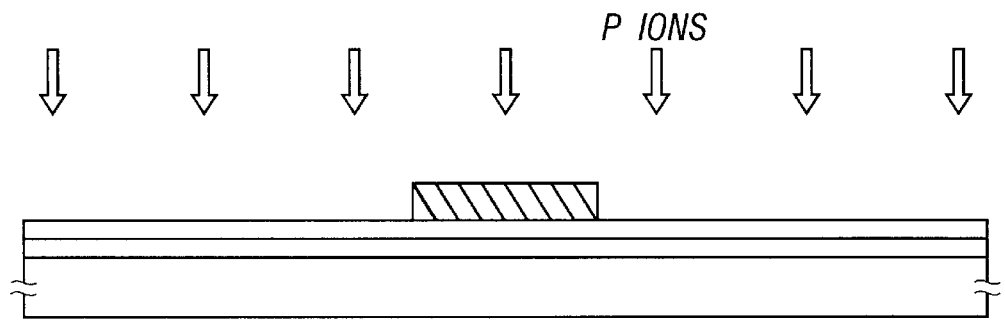
Figure 9B:
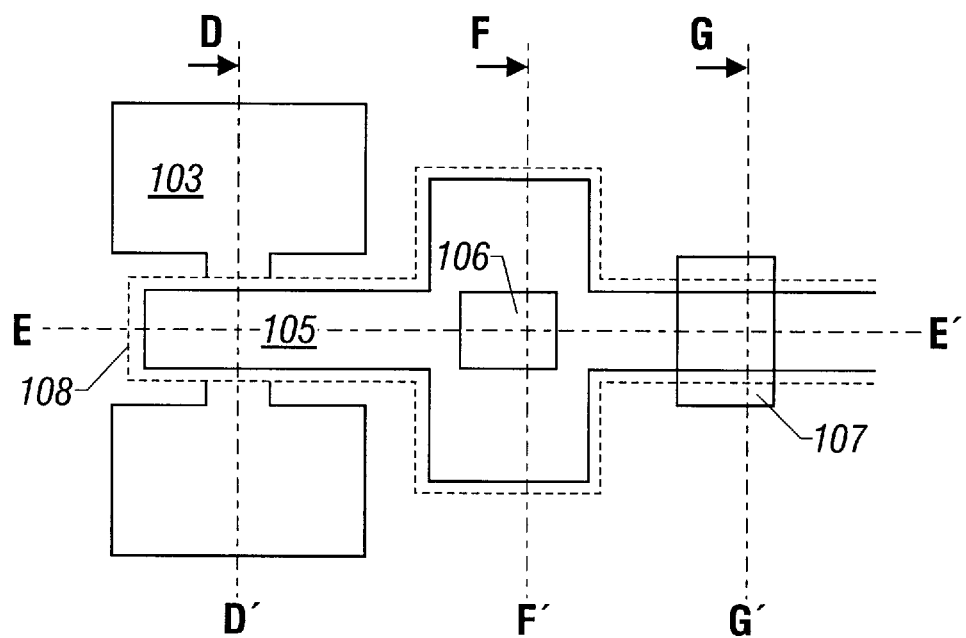

Thus, a state shown in FIGS. 1A, 2A, 3A and 4A is obtained. FIG. 9B is a top view in this state. The cross-section of FIG. 2A is one taken along line D—D' in FIG. 9B, the cross-section of FIG. 1A is one taken along line E—E' in FIG. 9B, the cross-section of FIG. 3A is one taken along line F—F' in FIG. 9B, and the cross-section of FIG. 4A is one taken along line G—G' in FIG. 9B.

The resist masks 106 and 107 are removed after completion of the anodizing step. Impurity ions are then implanted to form source/drain regions. In this embodiment, to form an N-channel thin-film transistor, P (phosphorus) ions are implanted by plasma doping. (FIGS. 1B, 2B, 3B and 4B)

A source region 109 and a drain region 112 are formed by the implantation of P ions. At the same time, a channel forming region 111 and offset gate regions 110 are formed.

Figure 1C:
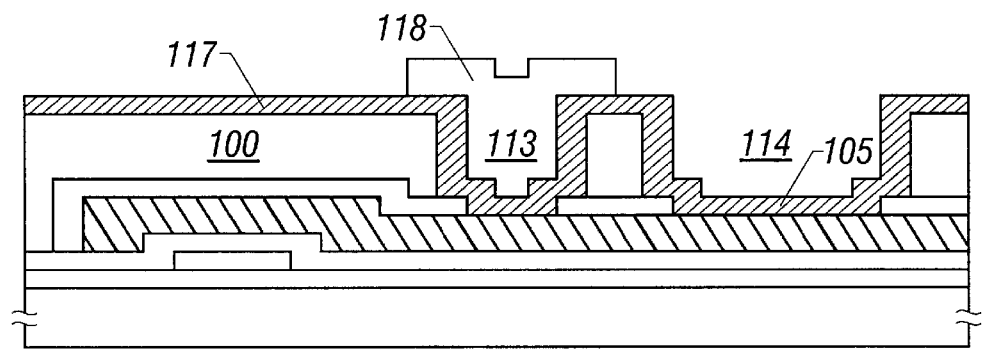
Figure 1D:
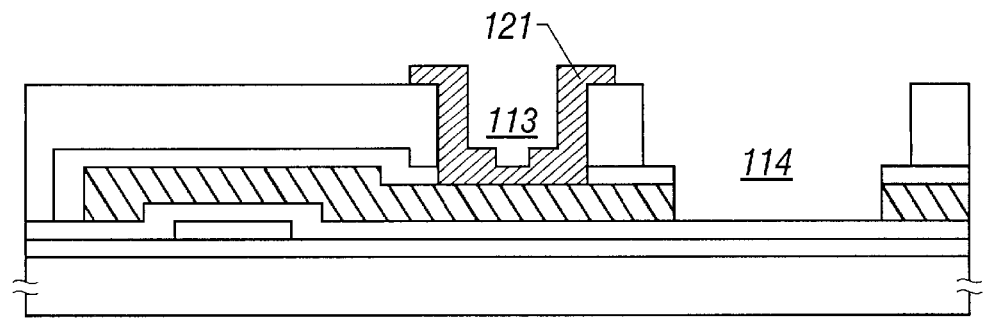
Figure 2C:
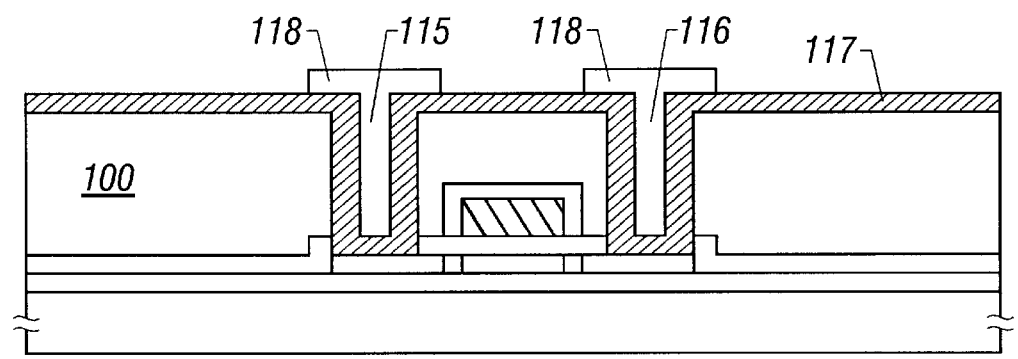
Figure 2D:
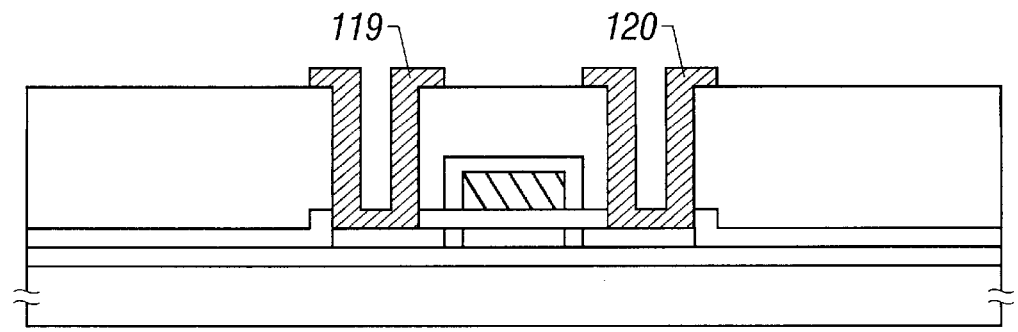
Figure 3C:
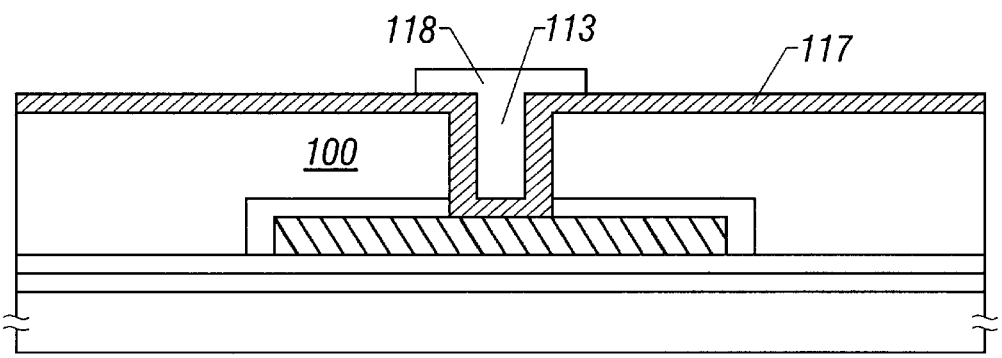
Figure 3D:
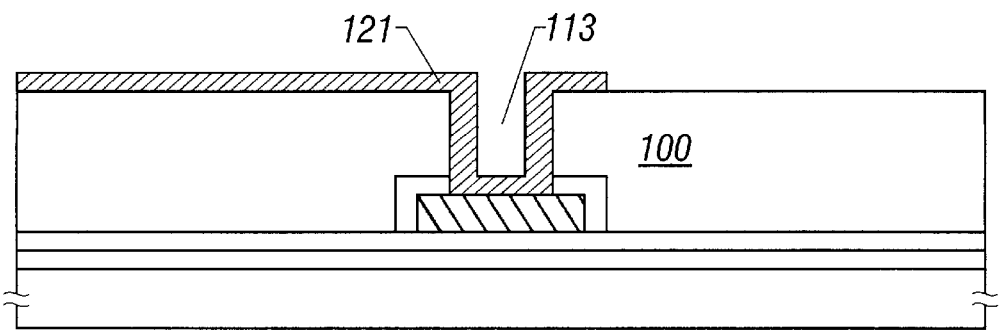
Figure 4C:
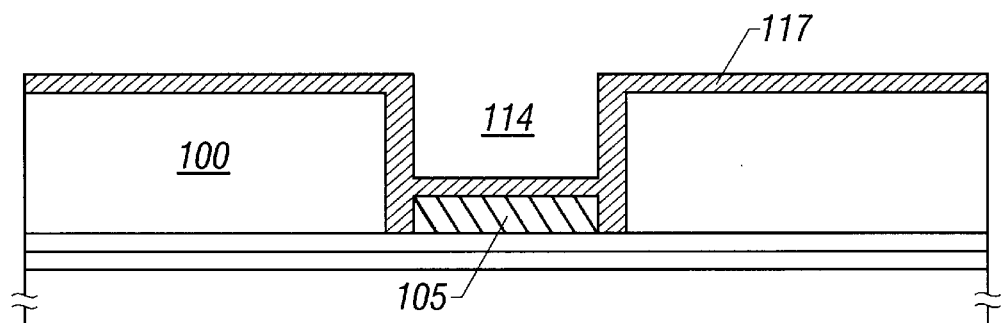
Figure 4D:
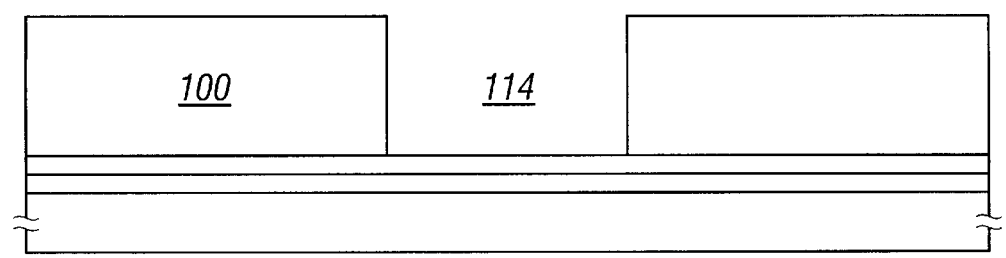
Figure 5A:
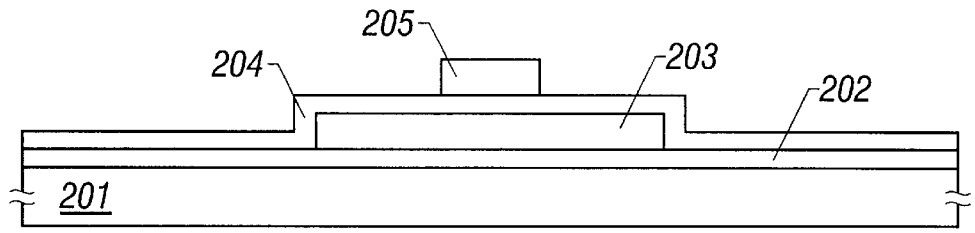
FIGS. 5A to 5D are sectional views showing a conventional manufacturing process of a thin-film transistor.
Figure 5B:
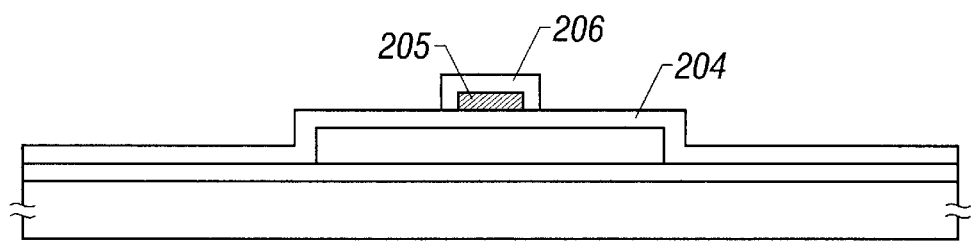
Figure 5C:
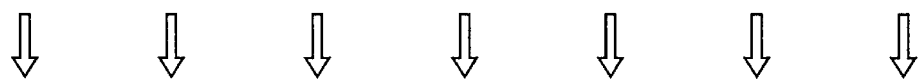
Figure 5C:
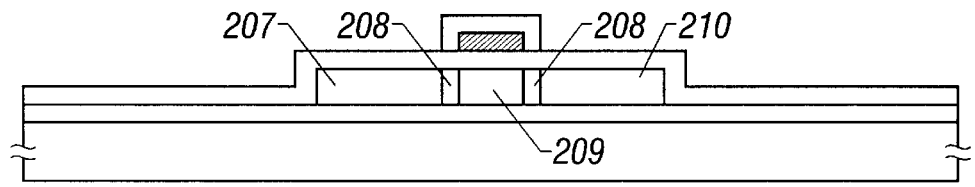
Figure 5D:
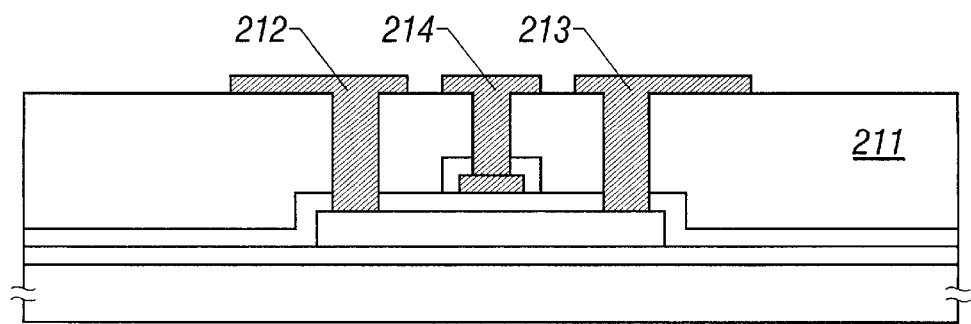

Thereafter, a 7,000-Å-thick silicon oxide film 100 as an interlayer insulating film is deposited by plasma CVD using a TEOS gas. Contact holes 115 and 116 for the source region 109 and the drain region 112, respectively, are then formed as shown in FIG. 2C. At the same time, a contact hole 113 for the gate electrode 105 is formed as shown in FIGS. 1C and 3C, and an opening 114 by removing a portion of the silicon oxide film 100 in a disconnecting region as shown in FIGS. 1C and 4C. That is, the contact holes 113, 115 and 116 and the opening 114 are formed at the same time.

This step is performed by wet etching that uses a mixed etchant of buffer hydrofluoric acid and acetic acid. In this step, in the regions corresponding to the contact holes 115 and 116 (see FIG. 2C), the silicon oxide film 104 starts to be etched upon completion of the etching of the silicon oxide film 100. In the regions corresponding to the contact hole 113 (see FIG. 3C) and the opening 114 (see FIG. 4C), the gate electrode 105 starts to be etched upon completion of the etching of the silicon oxide film 100.

Although in the figures the silicon oxide film 100 is drawn as if to have a non-uniform thickness, actually it can be regarded as having a uniform thickness because it is raised in the region corresponding to the gate electrode 105 by the thickness thereof.

Figure 6A:
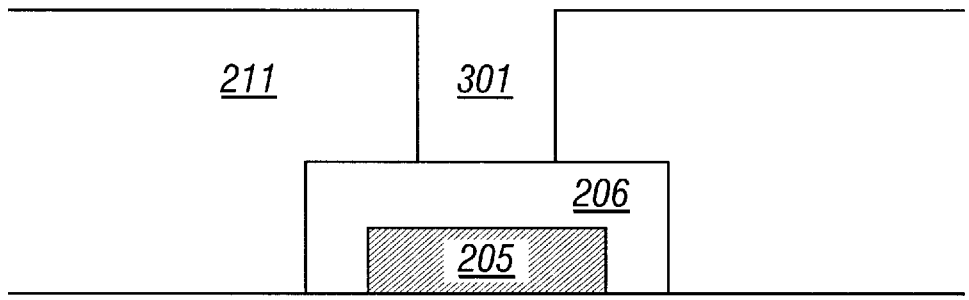
FIGS. 6A and 6B are enlarged views of a contact hole shown in FIG. 5D.
Figure 6B:
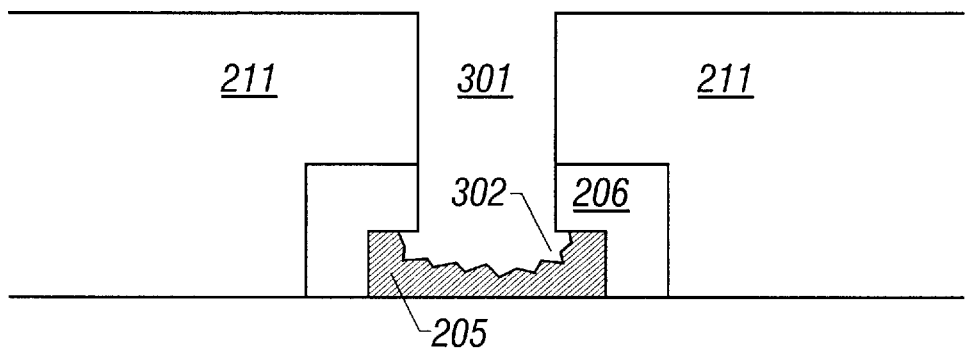

According to a measurement, when buffer hydrofluoric acid is used as an etchant, the etching rate of aluminum is about half that of silicon oxide. The thickness of the silicon oxide film 104 is about 1,000 Å (1,500 Å at the maximum), and in general the thickness of the gate electrode 105 is more than 4,000 Å. Therefore, in the state that the contact holes 115 and 116 are formed by etching of the silicon oxide film 104 in the above step, a top portion of the gate electrode 105 is etched. However, the gate electrode 105 is etched only slightly, and therefore does not result in a state as shown in FIG. 6B.

The above etching step is adapted to finish when the silicon active layer 103 is exposed, based on the etching rate of silicon oxide. In the above manner, the contact holes 115 and 116 for the source region 109 and the drain region 112, respectively, the contact hole 113 for the gate electrode 105, and the opening 114 in the disconnecting region are formed at the same time. (FIGS. 1C, 2C, 3C and 4C)

Figure 10A:
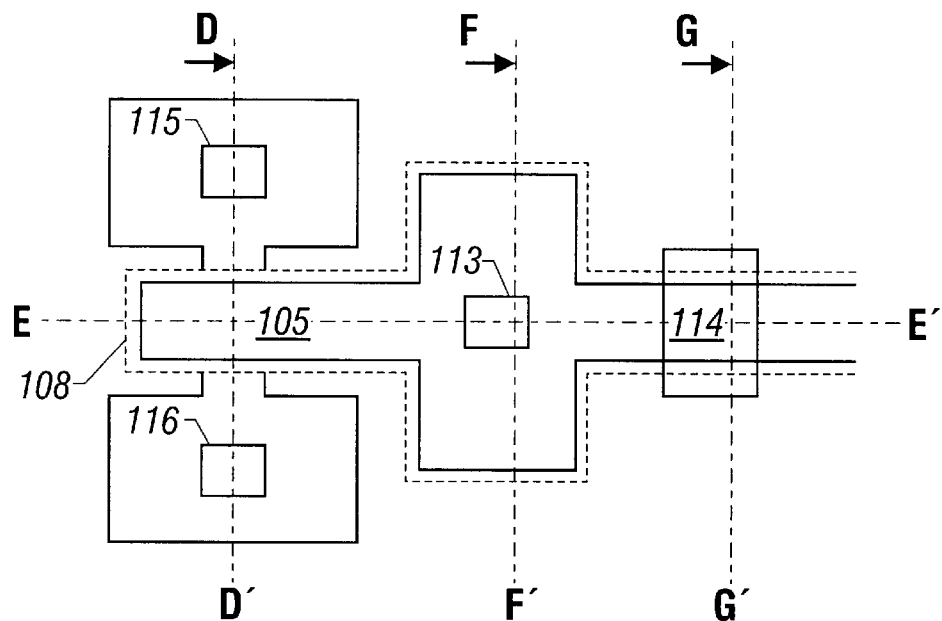

FIG. 10A is a top view showing this state, in which the contact holes 115 and 116 for the source region 109 and the drain region 112, respectively, the contact hole 113 for the gate electrode 105, and the opening 114 in the disconnecting region are formed.

Next, the active layer 103 is exposed in the contact holes 115 and 116, and the gate electrode 105 is exposed in the contact hole 113 and the opening 114.

Even if some misalignment occurs in forming the contact hole 113, no particular problem occurs in the operation of a resulting thin-film transistor. This allows a certain level of error in the related manufacturing operations. This is because since almost no current flows through the gate electrode 105, a small variation of the contact area between the gate electrode 105 and its lead-out electrode does not much affect the operation of a resulting transistor.

Subsequently, a multi-layer film 117 consisting of a titanium film and an aluminum film is deposited. This multi-layer film 117 is to constitute a second-layer wiring. The reason why a multi-layer film of a titanium film and an aluminum film is used is to prevent a possible electrical contact failure at the contact holes 115 and 116. A resist mask 118 is then formed to pattern the multi-layer film 117. Thus, the state shown in FIGS. 1C, 2C, 3C and 4C is obtained.

In this state, dry etching (RIE) is performed to remove the exposed portions of the multi-layer film 117, by using a mixed gas of $BCl_3$, $Cl_3$ and $SiCl_4$.

In this step, the multi-layer film 117 consisting of the titanium film and the aluminum film is patterned. At the same time, the portion of the multi-layer film 117 and the portion of the gate electrode 105 both existing in the region of the opening 114 are etched. Thus, the gate electrode 105 is divided in this patterning step. That is, the patterning of the second-layer wiring and the division of the gate wiring line (electrode) 105 are performed at the same time.

Since the dry etching is effected by using a chlorine type etching gas, it is substantially stopped when encountering the silicon oxide film 104. Therefore, the silicon oxide film 104 can be substantially used as an etching stopper. This is because in etching with a chlorine type gas, the etching rate of a silicon oxide film is much lower than the etching rates of aluminum and titanium films.

The above etching step may be performed by wet etching. But in such a case the etching step becomes complex, because different etchants need to be used to etch the titanium film and the aluminum film.

Figure 10B:
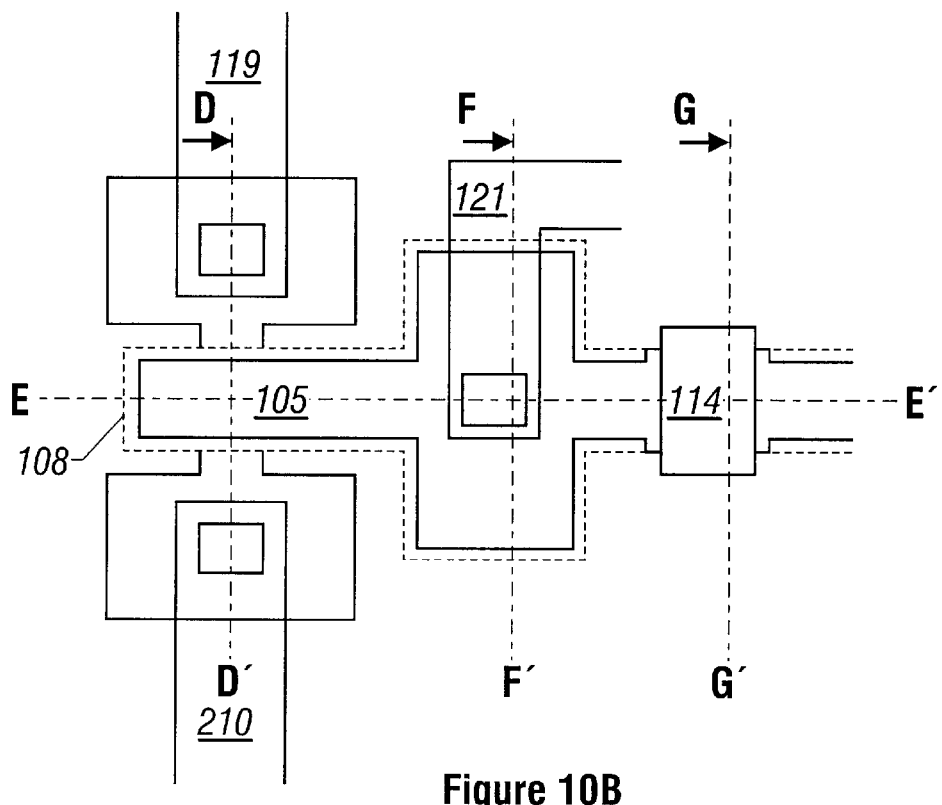

In the above manner, a source electrode 119 and a drain electrode 120 (see FIG. 2D) and a contact electrode 121 for the gate electrode 105 (see FIGS. 1D and 3D) are formed. Further, the gate electrode 105 is divided at the opening 114 (see FIGS. 1D and 4D). FIG. 10B is a top view showing this state. Thus, a thin-film transistor is completed. FIG. 10B clearly shows that the gate electrode 105 is divided at the opening 114.

Figure 7:
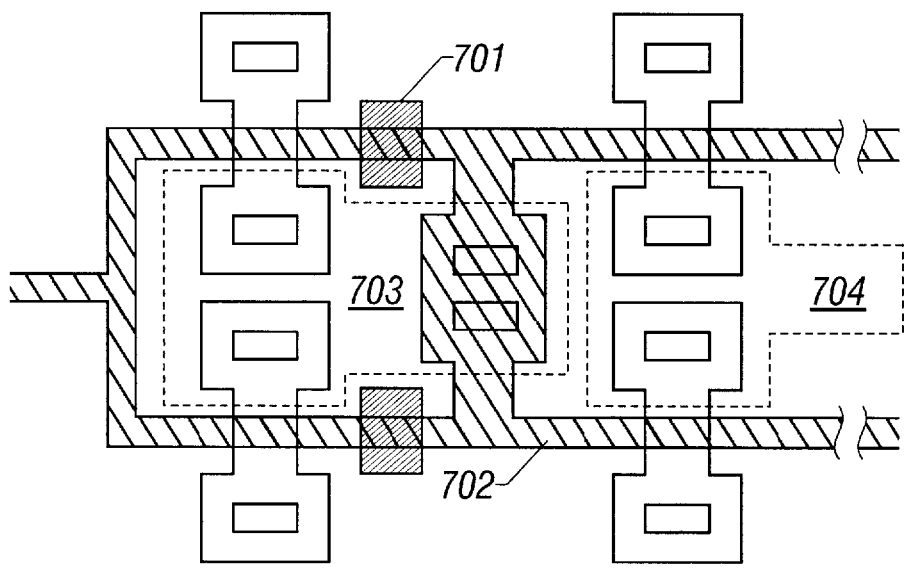
FIG. 7 shows an example of a circuit pattern constituted of thin-film transistors.

Although this embodiment is directed to the case of producing a single thin-film transistor to simplify the description, in practice a complex circuit is formed by a number of thin-film transistors. FIG. 7 shows an example of part of such a circuit. Specifically, FIG. 7 shows a circuit (inverter circuit) that constitutes part of a peripheral driver circuit of an active matrix liquid crystal display device.

Figure 8:
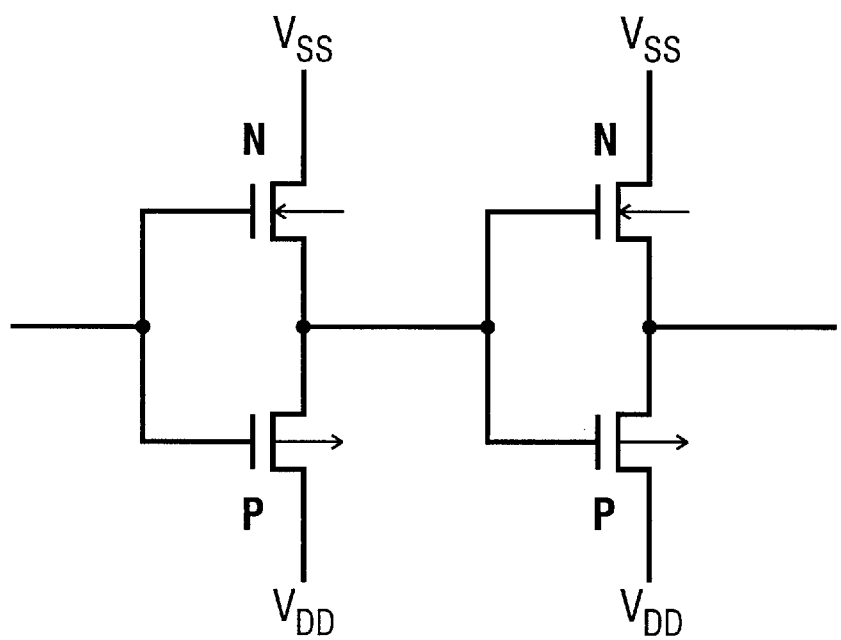
FIG. 8 is a circuit diagram corresponding to FIG. 7.

FIG. 8 is a circuit diagram corresponding to FIG. 7. A wiring line 702 in FIG. 7 corresponds to the gate electrode 105 in FIGS. 1A to 1D, FIGS. 2A to 2D, etc., and electrodes 703 and 704 in FIG. 7 correspond to the drain electrode 120 in FIGS. 1A to 1D, FIGS. 2A to 2D, etc.

In FIG. 7, 701 denotes a disconnecting region. The gate electrode (wiring line) 702 is partially removed at the region 701 in the same manner as the gate electrode 105 is done so at the opening 114 (see FIGS. 1D, 4D and 10B).

Although FIG. 7 shows a partial circuit pattern, in practice a complex circuit is constructed in which a large number of disconnecting regions like the region 701 are provided.
Embodiment 2

This embodiment is a modification of the first embodiment. This embodiment is characterized in that a wiring line is formed by utilizing the region of the opening 114 where the gate electrode 105 is divided in the first embodiment (see FIGS. 1D and 10B).

Figure 11A:
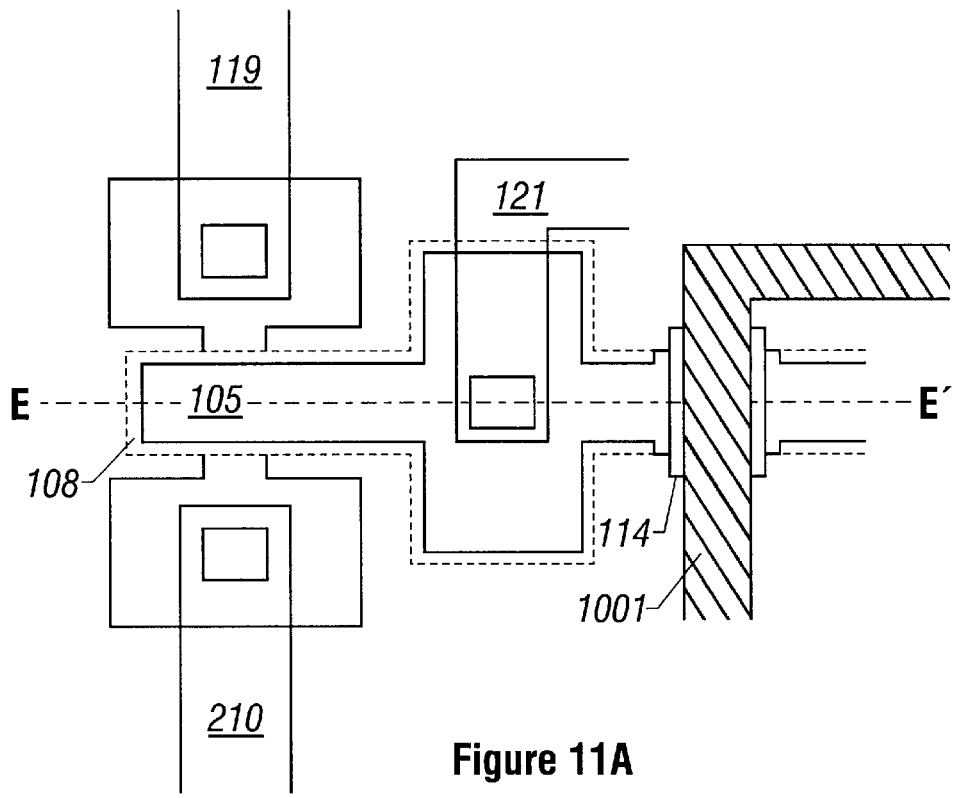
FIGS. 11A and 11B are a top view and a sectional view showing a manufacturing process of a thin-film transistor according to a second embodiment of the invention.
Figure 11B:
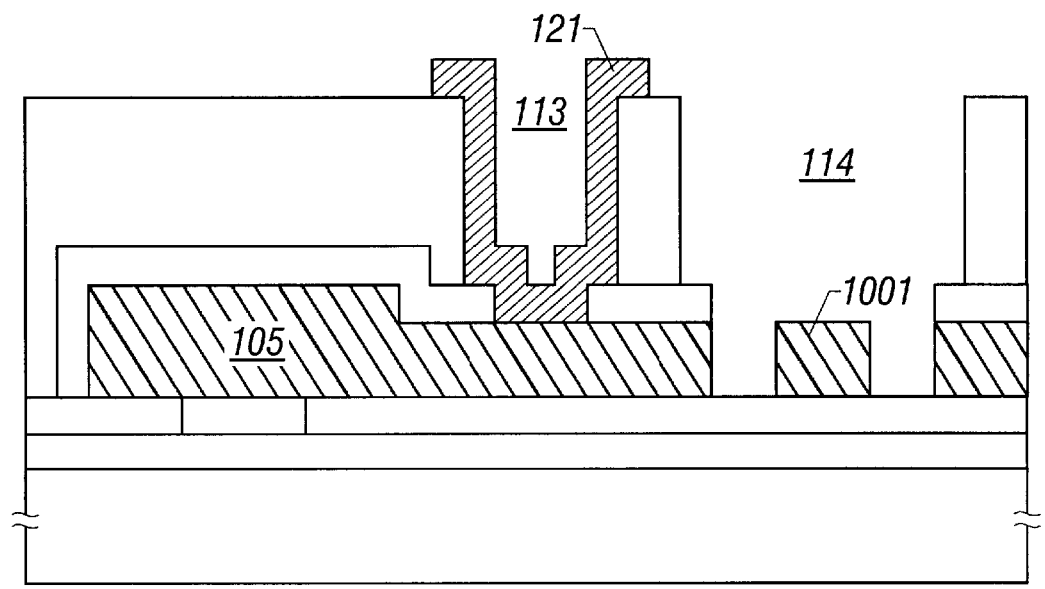

FIGS. 11A and 11B show a general configuration according to this embodiment. In this embodiment, as shown in FIG. 11A, a wiring line 1001 is formed by utilizing the disconnecting region. FIG. 11B is a sectional view taken along line E—E' in FIG. 11A.

The wiring line 1001 may be formed such that it is deposited as part of the gate electrode 105 and is separated from the latter in the opening 114 when the conductive film 117 is patterned by using a mask to form the contact electrode 121. The gate electrode 105 is divided when the wiring line 1001 is separated therefrom.

According to the invention, by forming, in an anodizing step, an anodic oxide layer on and in the vicinity of an aluminum wiring line or electrode or a wiring line or electrode mainly made of aluminum (first layer) so as to exclude a selected region by forming a mask in advance, formation of a contact (second layer) to the above wiring line or electrode in a subsequent step can be facilitated.

Since a contact hole can be formed without the need of removing a hard-to-etch film (anodic oxide film) made only or mainly of aluminum oxide, a manufacturing process of a thin-film semiconductor device or a semiconductor integrated circuit can be made easier and more stable. As a result, the production yield of a thin-film semiconductor device or a semiconductor integrated circuit can be increased.

Further, by also masking, in the above step of forming the mask, a region where the first-layer wiring line or electrode should be divided later, the second-layer wiring line or electrode can be divided at the same time as it is patterned. Thus, the number of patterning steps can be reduced by one. This contributes to reduction of the production cost as well as increase of the production yield.

While the present invention has been described in conjunction with the preferred embodiments, the scope of the present invention should not be limited to these particular examples disclosed in the preferred embodiments. Many modifications may be made without departing from the scope of the appended claims. For example, aluminum is used in the embodiments, other anodizable metals such as tantalum may be used instead of aluminum. Also, as the interlayer insulator, it is possible to use other materials such silicon nitride instead silicon oxide.

What is claimed is:

1. A method of manufacturing a semiconductor device comprising the steps of:

forming an insulating layer on a semiconductor layer;

preparing a wiring comprising an anodizable material on said insulating layer;

forming masks on a first portion of said wiring to be used as a contact region and on a second portion of said wiring at which said wiring is to be disconnected;

anodic oxidizing only an exposed surface of said wiring, wherein said first and second portions are not subject to the anodic oxidation because of said masks;

removing said masks after said anodic oxidizing;

forming an interlayer insulating film on said wiring and said insulating layer after removing said masks;

selectively etching said interlayer insulating film to expose said first and second portions of the wiring, wherein a contact hole for said semiconductor layer is formed through said interlayer insulating film simultaneously by said etching;

forming a conductive film on said interlayer insulating film and said first and second portions of the wiring after said etching; and patterning said conductive film so that an electrode in contact with the first portion of the wiring is formed as well as said wiring is disconnected at said second portion.

2. The method of claim 1 wherein said wiring comprises aluminum.

3. The method of claim 1 wherein said anodic oxidizing is carried out in an electrolyte with said wiring used as an anode.

4. The method of claim 1 wherein said masks are removed after said anodic oxidizing and before said interlayer insulating film is formed.

5. A method according to claim 1 wherein said semiconductor layer comprises crystalline silicon formed on an insulating surface.

6. A method of manufacturing a semiconductor device comprising:

preparing a substrate having an insulating surface;

forming a plurality of semiconductor islands on said insulating surface;

forming an insulating film on each of said semiconductor islands, said insulating film functioning as a gate insulating film of a transistor;

forming a gate wiring on said substrate, said gate wiring including gate electrodes extending over said semiconductor islands;

forming masks on first portions of said gate wiring to be used as contact regions and on second portions of said gate wiring at which said gate wiring is to be disconnected;

anodic oxidizing exposed surfaces of said gate wiring to form an anodic oxide film thereon, wherein said first and second portions are not subject to said anodic oxidizing because of said masks;

removing said masks after said anodic oxidizing;

introducing ions of a dopant impurity into said semiconductor islands using at least said gate wiring as a mask in order to form impurity regions in said semiconductor islands;

forming an interlayer insulating film on said substrate, covering said semiconductor islands, said insulating film and said gate wiring provided with said anodic oxide film;

selectively etching said interlayer insulating film so that contact holes for said semiconductor islands and said first portions of the gate wiring are formed and said second portions of the wiring are exposed;

forming a conductive film on said interlayer insulating film so that said conductive film electrically contacts said semiconductor islands and the first portions of the gate wiring through said contact holes;

patterning said conductive film by selective etching to form electrodes for said gate wiring and said semiconductor islands and simultaneously to disconnect said gate wiring at said second portions.

7. A method of manufacturing a semiconductor device comprising:

forming an insulating layer/on a semiconductor layer;

preparing a wiring comprising an anodizable material on said insulating layer, said wiring including a gate electrode over said semiconductor layer;

forming a mask on a portion of said wiring;

anodic oxidizing a surface of said wiring wherein a portion of said wiring covered by said mask is prevented from being oxidizing by said mask;

removing said mask after the anodic oxidation;

forming an interlayer insulating film over said wiring after removing said mask;

opening a hole within said interlayer insulating film to expose said portion of the wiring;

forming a conductive film on said insulating film and within said hole; and patterning said conductive film to form an interconnect while said wiring is disconnected simultaneously at said portion.

8. A method according to claim 7 wherein said semiconductor layer comprises crystalline silicon formed on an insulating surface.

9. A method according to claim 7 wherein said interconnect is electrically connected to said semiconductor layer through a contact hole opened through said interlayer insulating film.

10. A method according to claim 7 wherein said interconnect is electrically connected to said gate electrode through a contact hole opened through said interlayer insulating film.

11. A method according to claim 7 wherein said wiring comprises a material selected from the group consisting of tantalum and aluminum.

12. A method according to claim 7 wherein said interlayer insulating film comprises silicon oxide.

13. A method according to claim 7 wherein said interlayer insulating film comprises silicon nitride.

* * * * *